(12) United States Patent
Choi

(10) Patent No.: US 11,437,107 B2
(45) Date of Patent: Sep. 6, 2022

(54) SEMICONDUCTOR MEMORY APPARATUS AND OPERATING METHOD THEREOF, AND SEMICONDUCTOR MEMORY SYSTEM

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 36 days.

(21) Appl. No.: 17/144,491

(22) Filed: Jan. 8, 2021

(65) Prior Publication Data
US 2021/0391020 A1  Dec. 16, 2021

(30) Foreign Application Priority Data

Jun. 10, 2020  (KR) .................. 10-2020-0070566

(51) Int. Cl.
| | |
|---|---|
| G11C 7/00 | (2006.01) |
| G11C 16/26 | (2006.01) |
| G11C 16/10 | (2006.01) |
| G11C 7/10 | (2006.01) |
| G11C 16/32 | (2006.01) |
| G11C 16/24 | (2006.01) |

(52) U.S. Cl.
CPC ............. *G11C 16/26* (2013.01); *G11C 7/1084* (2013.01); *G11C 16/10* (2013.01); *G11C 16/24* (2013.01); *G11C 16/32* (2013.01)

(58) Field of Classification Search
CPC ....... G11C 7/1051; G11C 7/1078; G11C 7/22; G11C 7/106; G11C 7/1057
USPC ...................................... 365/189.05
See application file for complete search history.

(56) References Cited

U.S. PATENT DOCUMENTS

| | | | | |
|---|---|---|---|---|
| 2014/0293693 A1* | 10/2014 | Nam | ................. | G11C 16/3427 365/185.11 |
| 2017/0109527 A1* | 4/2017 | Kim | ...................... | G06F 21/755 |

FOREIGN PATENT DOCUMENTS

| | | |
|---|---|---|
| KR | 10-2017-0069010 | 6/2017 |
| KR | 10-2021-0070107 A | 6/2021 |

* cited by examiner

*Primary Examiner* — Son T Dinh
(74) *Attorney, Agent, or Firm* — IP & T Group LLP

(57) ABSTRACT

A semiconductor memory device may include a caching latch circuit and a sensing latch circuit. The caching latch circuit may store setup data. The sensing latch circuit may store sensing data.

14 Claims, 8 Drawing Sheets

SEMICONDUCTOR MEMORY APPARATUS AND OPERATING METHOD THEREOF, AND SEMICONDUCTOR MEMORY SYSTEM

CROSS-REFERENCE TO RELATED APPLICATION

The present application claims priority under 35 U.S.C. § 119(a) to Korean application number 10-2020-0070566, filed on Jun. 10, 2020, in the Korean Intellectual Property Office, which is incorporated herein by reference in its entirety.

BACKGROUND

1. Technical Field

Various embodiments generally relate to a semiconductor memory device and an operating method thereof, and a semiconductor memory system, and more particularly, to a semiconductor memory device capable of performing a program operation for storing data and an operating method thereof, and a semiconductor memory system.

2. Related Art

In general, there are two types of semiconductor memory devices: volatile memory devices and non-volatile memory devices. Both types are capable of performing a data processing operation of storing data or outputting stored data using power applied thereto. In this case, the volatile memory device has an advantage of a fast data processing operation speed, but has a disadvantage in that it needs to be continuously supplied with power in order to maintain stored data. Furthermore, the non-volatile memory device has an advantage in that it does not need to be continuously supplied with power in order to maintain stored data, but has a disadvantage of a slow data processing speed.

These days, as process and design technologies continue to advance remarkably, the difference between the data processing speed of a volatile memory device and the data processing speed of a non-volatile memory device has been significantly reduced. Accordingly, the non-volatile memory device, with its advantage of not requiring power to maintain stored data, has recently been in the spotlight.

A representative example of a non-volatile memory device is a NAND type flash memory device in which a plurality of memory cells are coupled in series to form a string structure. A memory cell of the NAND type flash memory device includes a floating gate. Accordingly, the memory cell can store logic "high" data and logic "low" data by injecting electrons into the floating gate or discharging electrons from the floating gate through a Fowler-Nordheim tunneling method.

A non-volatile memory device, including the NAND type flash memory device, performs a program operation in order to store data in a memory cell and performs a read operation in order to output data stored in a memory cell. Furthermore, a non-volatile memory device performs an erase operation in order to erase data from a memory cell prior to a program operation.

A memory cell of a non-volatile memory device is a single level cell (SLC), a multi-level cell (MLC), a triple level cell (TLC) or a quadruple level cell (QLC) depending on the number of distributions of data stored in one memory cell during a program operation. An SLC stores 1 bit capable of representing two different states, an MLC stores 2 bits capable of representing four different states, a TLC stores 3 bits capable of representing eight different states, and a QLC stores 4 bits capable of representing 16 different states.

Unlike the volatile memory device, the non-volatile memory device includes therein a page buffer circuit coupled to the memory cells. In general, the page buffer circuit includes a plurality of latch circuits. The plurality of latch circuits stores input data to be stored in the memory cells during a program operation or stores setup data during a setup operation prior to a program operation. In order for the program operation to be smoothly performed, a specific node needs to be previously driven based on a set value prior to the program operation. The set value is the setup data. Accordingly, the plurality of latch circuits stores the setup data during a setup operation and drives the specific node based on the setup data prior to the program operation so that the program operation can be smoothly performed.

In this case, the setup data is stored in a plurality of the latch circuits according to a set setup-data-latch sequence. That is, the setup data is not fixed and stored in one of the plurality of latch circuits, but is latched by the plurality of latch circuits according to a set setup-data-latch sequence. The reason why the setup data needs to be latched by the plurality of latch circuits according to a set sequence is that the physical number of latch circuits is limited.

The setup-data-latch sequence may be slightly different depending on circuit design or circuit operation. However, in general, the setup-data-latch sequence tends to be standardized in certain ways unless the physical design of a plurality of latch circuits is significantly changed. For this reason, the amount of increase in the operating speed of an existing semiconductor memory device is limited due to the standardized setup-data-latch sequence.

SUMMARY

Various embodiments are directed to the provision of a semiconductor memory device capable of performing a setup operation and a program operation by changing a setup-data-latch sequence.

Also, various embodiments are directed to the provision of a semiconductor memory system capable of controlling a setup operation time.

Objects of the present disclosure are not limited to the aforementioned objects, and other objects not described above may be evidently understood by those skilled in the art, to which the present disclosure pertains, from the following description.

In an embodiment, a semiconductor memory device may include a memory cell array configured to store input data received from an external source and a plurality of page buffer circuits coupled to the memory cell array through a bit line and configured to transfer the input data to the bit line during a program operation. Each of the plurality of page buffer circuits may include a caching latch circuit coupled to a sensing node to which the input data is transferred and configured to store setup data and a sensing latch circuit configured to store sensing data sensed through the bit line during a sensing operation. During a setup operation prior to the program operation, the setup data stored in the caching latch circuit is transferred to the sensing latch circuit.

In an embodiment, an operating method of a semiconductor memory device may include transferring setup data from a caching latch circuit to a sensing latch circuit and storing the setup data in the sensing latch circuit, during a setup operation prior to performing a program operation, driving a bit line by the setup data stored in the sensing latch circuit, and transferring the setup data from the sensing latch circuit to at least one of a plurality of data latch circuits during the program operation.

In an embodiment, a semiconductor memory system may include a host device configured to provide program timing information and a semiconductor memory device configured to control a setup operation time based on the program timing information.

In an embodiment, a semiconductor memory device may include a memory cell array configured to store program data, a first latch configured to generate setup data, a second latch configured to latch the setup data from the first latch during a setup operation, and a third latch configured to latch the setup data from the second latch during a program operation of storing the program data into the array after the setup operation. The second latch is further configured to latch again, after the program operation, the setup data from the third latch for a subsequent program operation. A bit line is coupled to the array and driven by the setup data latched in the second latch.

DETAILED DESCRIPTION

The embodiments described below are merely exemplary of the structural and/or functional aspects of the present invention. The invention, however, is not limited to embodiments described in the specification. That is, the invention may take many different forms and configurations, as those skilled in the art will recognize from the disclosure. The present invention encompasses all such variations that fall within the scope of the claims. Furthermore, objects or effects proposed in the present disclosure are not necessarily associated with every embodiment. Accordingly, the scope of the claims is not limited thereby.

Also, throughout the specification reference to "an embodiment" or the like is not necessarily to only one embodiment, and different references to any such phrase is not necessarily to the same embodiment. The term "embodiments" when used herein does not necessarily refer to all embodiments. The meaning of terms described in this application should be understood as follows.

Terms, such as "first" and the "second", are used to distinguish one element from another element that otherwise have the same or similar names, not to indicate any substantive change in the element itself. Thus, the present invention should not be limited in any way by these terms.

An element described in the singular may include plural instances of such element, unless clearly stated otherwise or the context clearly indicates that only one is intended. The terms, such as "include" or "have", should be understood in the open-ended sense as including the stated characteristics, numbers, steps, operations, elements, parts, or combination thereof, but not excluding the existence or addition of one or more other characteristics, numbers, steps, operations, elements, parts, or combination thereof.

In each of steps, symbols (e.g., a, b, and c) may be used for convenience of a description, but any such symbols do not necessarily indicate the order of the steps. The steps may be performed in any order consistent with the teachings herein, unless a specific order is indicated or the context clearly requires a specific order.

All terms used herein, including technological or scientific terms, have the same meanings as typically understood by those skilled in the art, unless otherwise defined. Terms defined in commonly used dictionaries should be construed in the context of the related technology and should not be construed ideally or in an excessively formal way, unless clearly so defined in the application.

Figure 1:
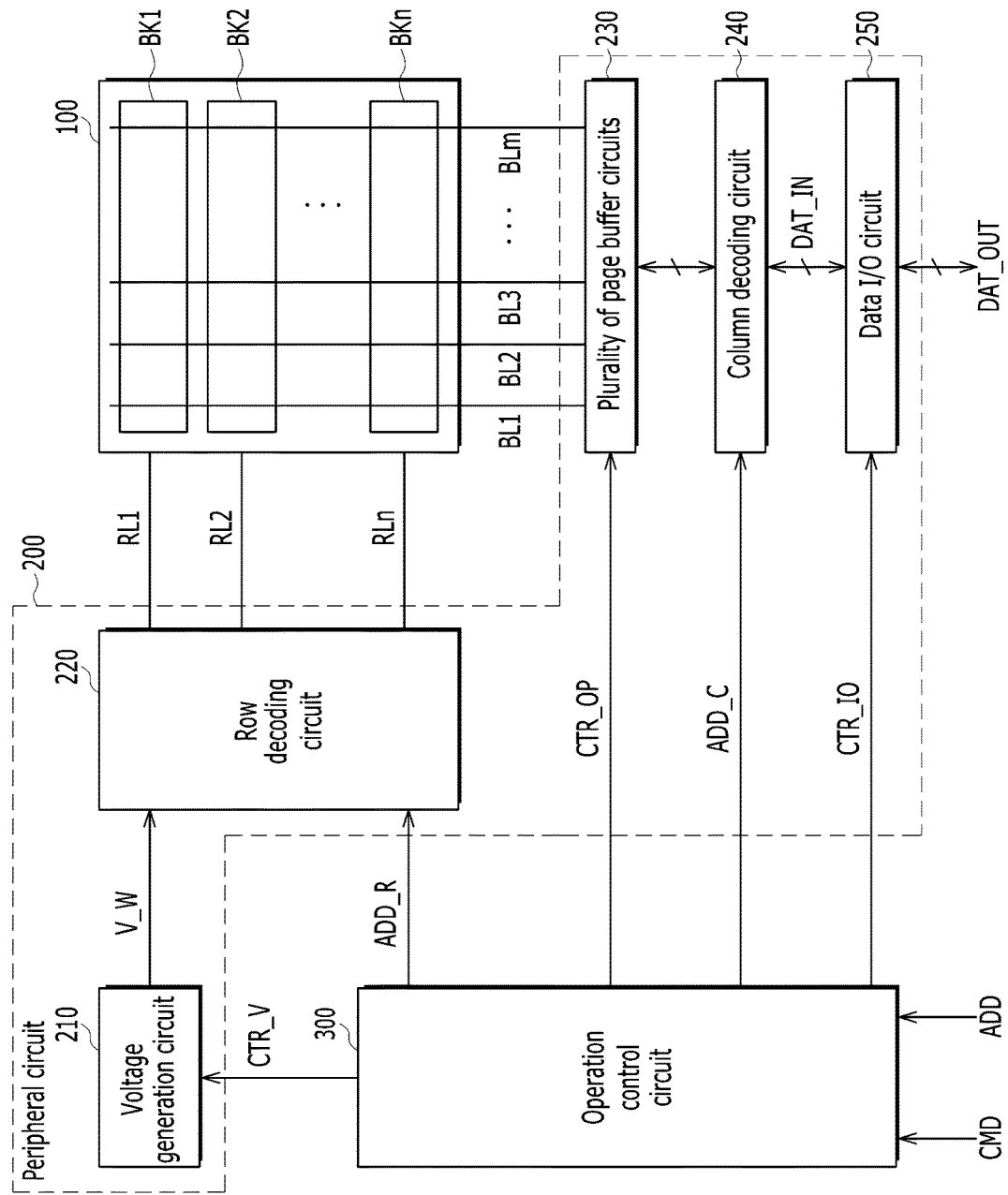
FIG. 1 is a block diagram illustrating a configuration of a semiconductor memory device according to an embodiment.

FIG. 1 is a block diagram illustrating a configuration of a semiconductor memory device according to an embodiment.

Referring to FIG. 1, the semiconductor memory device may include a memory cell array 100, a peripheral circuit 200, and an operation control circuit 300.

First, the memory cell array 100 may store data input or received from an external device. The memory cell array 100 may include a plurality of memory blocks BK1 to BKn (wherein n is a natural number). Each of the plurality of memory blocks BK1 to BKn may include a plurality of memory cells for storing input data. The plurality of memory cells may be coupled to a plurality of row lines RL1 to RLn and a plurality of bit lines BL1 to BLm (wherein m is a natural number), respectively, in a matrix form. As described below, the plurality of row lines RL1 to RLn may receive a set voltage from a row decoding circuit 220 according to a program operation, a read operation or an erase operation. Furthermore, the plurality of bit lines BL1 to BLm may receive, from a plurality of page buffer circuits 230, a set voltage corresponding to input and output data according to a program operation, a read operation or an erase operation.

The peripheral circuit 200 may control a program operation, a read operation or an erase operation for a target memory cell among the memory cell array 100. The peripheral circuit 200 may include a voltage generation circuit 210, the row decoding circuit 220, the plurality of page buffer circuits 230, a column decoding circuit 240, and a data input/output (I/O) circuit 250.

First, the voltage generation circuit 210 may generate an internal voltage V_W for a program operation, a read operation or an erase operation. The voltage generation circuit 210 may generate the internal voltage V_W, having various voltage levels, based on a voltage control signal CTR_V generated by the operation control circuit 300. For example, the voltage generation circuit 210 may generate the internal voltage V_W having voltage levels for a verification operation, a pass operation, etc. in addition to voltage levels for a program operation, a read operation, and an erase operation.

The row decoding circuit 220 may selectively apply, to the plurality of row lines RL1 to RLn, the internal voltage V_W generated by the voltage generation circuit 210. The row decoding circuit 220 may receive the internal voltage V_W from the voltage generation circuit 210, and may receive a row address signal ADD_R from the operation control circuit 300. In this case, the row address signal ADD_R may be a signal for selecting a corresponding row line among the plurality of row lines RL1 to RLn. Accordingly, the row decoding circuit 220 may apply a set internal voltage V_W to each of the plurality of row lines RL1 to RLn based on the row address signal ADD_R. Furthermore, although not illustrated, the row decoding circuit 220 may also be coupled to a drain selection line, a source selection line, and a common source line included in the memory cell array 100. Accordingly, the row decoding circuit 220 may apply the set internal voltage V_W to each of the drain selection line, the source selection line, and the common source line depending on a program operation, a read operation or an erase operation.

For example, during a program operation, the row decoding circuit 220 may apply a program voltage, that is, one of the internal voltages V_W, to a selected row line of the plurality of row lines RL1 to RLn, and may apply, to an unselected row line, a program pass voltage having a lower voltage level than the program voltage. Furthermore, during a verification operation, the row decoding circuit 220 may apply a verification voltage, that is, one of the internal voltages V_W, to a selected row line, and may apply, to an unselected row line, a verification pass voltage having a higher voltage level than the verification voltage. Furthermore, during a read operation, the row decoding circuit 220 may apply a read voltage to a selected row line, and may apply, to an unselected row line, a read pass voltage having a higher voltage level than the read voltage. Furthermore, upon erase operation, the row decoding circuit 220 may apply a ground voltage to a selected row line.

The plurality of page buffer circuits 230 may be coupled to the memory cell array 100 through the plurality of bit lines BL1 to BLm. The plurality of page buffer circuits 230 may transfer data to the plurality of bit lines BL1 to BLm during a program operation and receive data from the plurality of bit lines BL1 to BLn during a read operation. Each of the plurality of page buffer circuits 230 may be configured with a plurality of latch circuits. Each of the latch circuits may perform a program operation and a read operation on input and output data, based on an operation control signal CTR_OP generated by the operation control circuit 300.

The column decoding circuit 240 may control the transfer path of input and output data. The column decoding circuit 240 may receive, from the plurality of page buffer circuits 230, data to be output to the outside, and may receive, from the data I/O circuit 250, data to be input to the inside. Furthermore, the column decoding circuit 240 may receive a column address signal ADD_C from the operation control circuit 300, and may control the transfer path of input and output data. In this case, the column address signal ADD_C may be a signal for selecting the plurality of bit lines BL1 to BLm.

The data I/O circuit 250 may control the input and output of external data DAT_OUT and internal data DAT_IN. The data I/O circuit 250 may perform an I/O operation of data based on an I/O control signal CTR_IO generated by the operation control circuit 300. Accordingly, the data I/O circuit 250 may output the external data DAT_OUT, received from an external source, as the internal data DAT_IN during a program operation and may output the internal data DAT_IN, received from the column decoding circuit 240, as the external data DAT_OUT during a read operation, based on the I/O control signal CTR_IO.

The operation control circuit 300 may control the voltage generation circuit 210, the row decoding circuit 220, the plurality of page buffer circuits 230, the column decoding circuit 240, and the data I/O circuit 250, which are included in the peripheral circuit 200. The operation control circuit 300 may generate the voltage control signal CTR_V for controlling the voltage generation circuit 210 based on a command signal CMD and an address signal ADD from the outside, may generate the row address signal ADD_R to be provided to the row decoding circuit 220, may generate the operation control signal CTR_OP for controlling the plurality of page buffer circuits 230, may generate the column address signal ADD_C to be provided to the column decoding circuit 240, and may generate the I/O control signal CTR_IO for controlling the data I/O circuit 250. The operation control circuit 300 may control overall operation of the semiconductor memory device. The semiconductor memory device may perform a program operation, a read operation, an erase operation, etc. through the operation control circuit 300.

Figure 2:
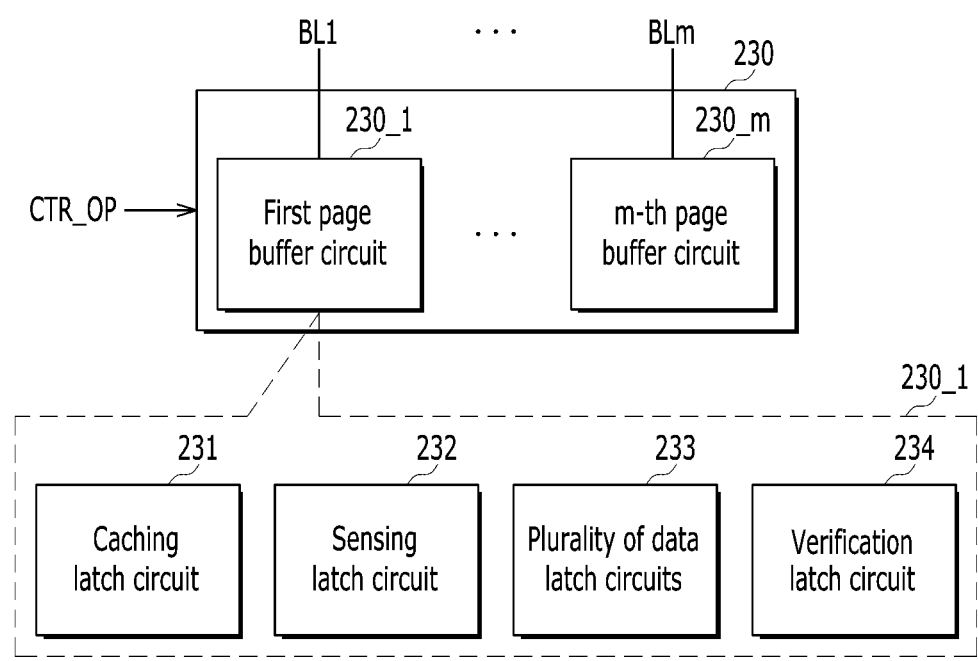
FIG. 2 is a block diagram illustrating a configuration of a plurality of page buffer circuits, such as those of FIG. 1.

FIG. 2 is a block diagram illustrating a configuration of the plurality of page buffer circuits 230 of FIG. 1.

Referring to FIG. 2, each of the plurality of page buffer circuits 230 may store data input and output according to a program operation and a read operation based on the operation control signal CTR_OP. Each of the plurality of page buffer circuits 230 may include first to m-th page buffer circuits 230_1 to 230_m coupled to the plurality of bit lines BL1 to BLm, respectively. Hereinafter, the first page buffer circuit 230_1 of the first to m-th page buffer circuits 230_1 to 230_m and that is coupled to the first bit line BL1 is described as a representative example.

Referring to FIG. 2, the first page buffer circuit 230_1 is coupled to the first bit line BL1, and may transmit input data to the first bit line BL1 during a program operation. The first page buffer circuit 230_1 may include a caching latch circuit 231 and a sensing latch circuit 232.

First, the caching latch circuit 231 may store setup data. The caching latch circuit 231 may efficiently operate a plurality of latch circuits in the first page buffer circuit 230_1. Accordingly, the caching latch circuit 231 may also store input data received during a program operation and output data output during a read operation, in addition to the setup data.

The sensing latch circuit 232 may store, in a sensing operation, sensing data transferred through the first bit line BL1. In this case, the sensing data may have a set logic level. Accordingly, the logic level of the sensing data may be maintained or may be inverted based on output data transferred through the first bit line BL1 during a read operation.

The semiconductor memory device according to an embodiment may include the caching latch circuit 231 and the sensing latch circuit 232 within each page buffer circuit. As described more specifically below, the page buffer circuit may transfer setup data from the caching latch circuit 231 to the sensing latch circuit 232 during a setup operation prior to a program operation. Accordingly, the page buffer circuit can minimize the setup-data-latch sequence during a setup operation. Minimizing the setup-data-latch sequence during a setup operation increases program operation timing speed, as well as overall program operation speed.

The first page buffer circuit 230_1 may further include a plurality of data latch circuits 233 and a verification latch circuit 234.

First, the plurality of data latch circuits 233 may store input data during a program operation. The number of data latch circuits included in the plurality of data latch circuits 233 may vary depending on the number of distributions of data stored in a memory cell, that is, the number states a memory cell is capable of representing. The semiconductor memory device according to an embodiment includes the plurality of data latch circuits 233. As described below, any one of the plurality of data latch circuits 233 may receive setup data from the sensing latch circuit 232 and may store the received setup data, during the program operation.

The verification latch circuit 234 may store verification data during a verification operation performed during a program operation. In this case, the verification data is used to determine whether input data stored in a memory cell formed a desired data distribution during a program operation. The number of verification latch circuits 234 may vary depending on the number of verification operations performed during a program operation. The semiconductor memory device according to an embodiment includes the verification latch circuit 234. As described below, the verification latch circuit 234 may be initialized during the program operation.

Figure 3A:
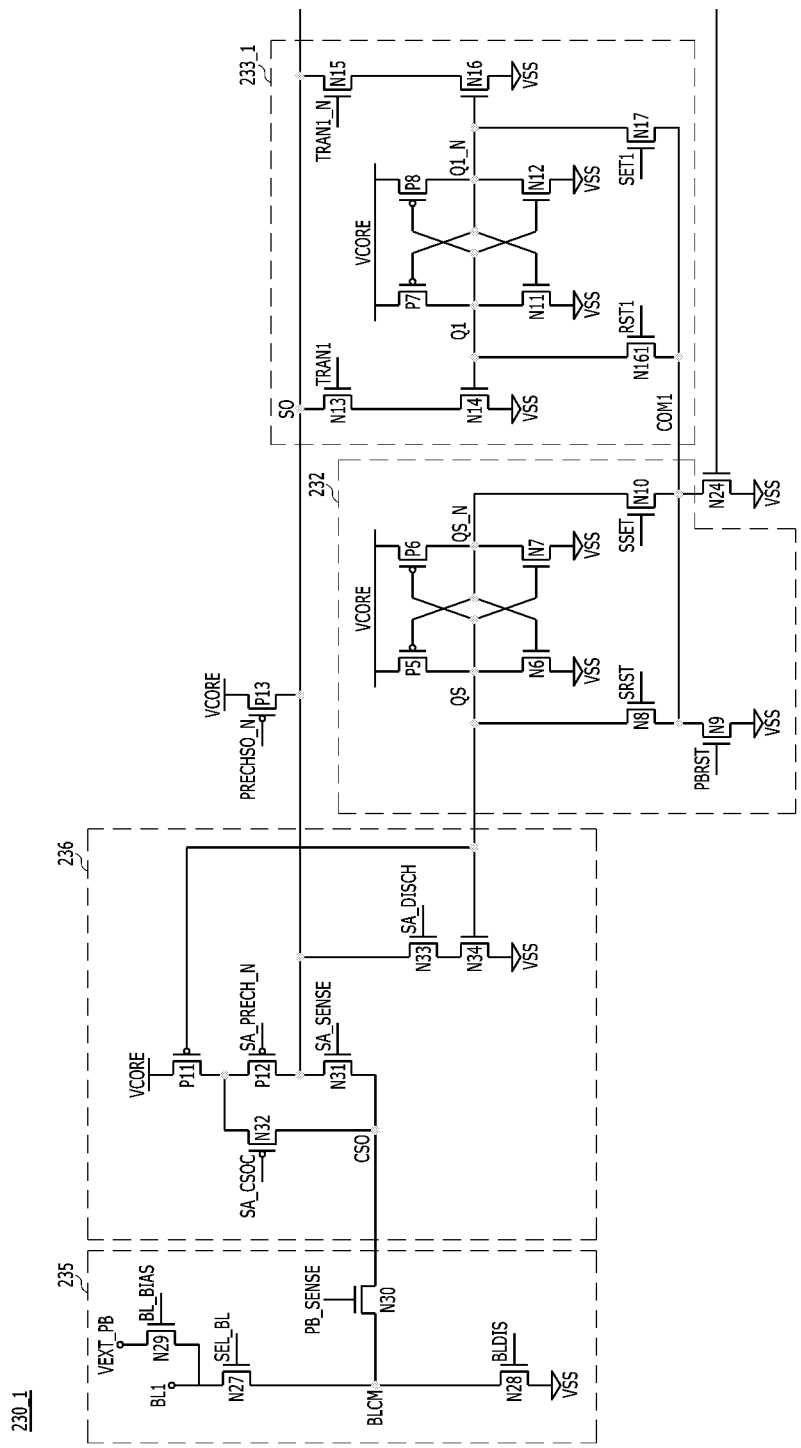
FIGS. 3A and 3B are circuit diagrams illustrating a configuration of a first page buffer circuit, such as that of FIG. 2.
Figure 3B:
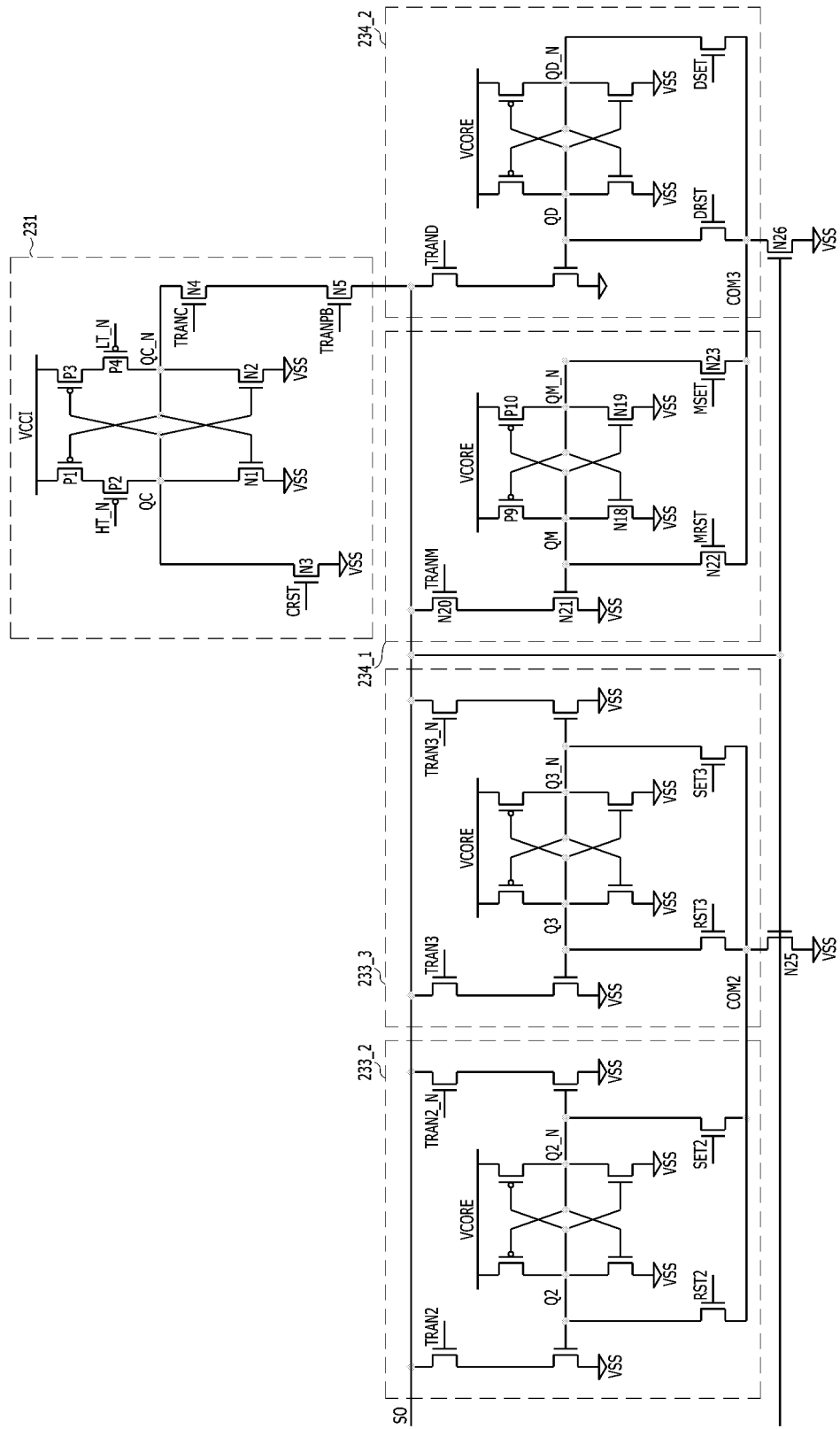

FIGS. 3A and 3B are circuit diagrams illustrating a configuration of the first page buffer circuit 230_1 of FIG. 2.

Referring to FIGS. 2, 3A and 3B, the first page buffer circuit 230_1 may include the caching latch circuit 231, the sensing latch circuit 232, first to third data latch circuits 233_1, 233_2, and 233_3 that are the plurality of data latch circuits 233, first and second verification latch circuits 234_1 and 234_2, that is, the verification latch circuit 234, a bit line coupling circuit 235, and a data sensing circuit 236.

The first page buffer circuit 230_1 may be controlled based on the operation control signal CTR_OP generated by the operation control circuit 300 of FIG. 1. That is, signals to control the first page buffer circuit 230_1 may be included in the operation control signal CTR_OP.

First, the caching latch circuit 231 is coupled to a sensing node SO and may store setup data. The caching latch circuit 231 may generate the setup data based on first and second control signals HT_N and LT_N.

More specifically, the caching latch circuit 231 may include a first PMOS transistor P1, a second PMOS transistor P2, and a first NMOS transistor N1 coupled in series between a power supply voltage stage VCCI and a ground voltage stage VSS. Furthermore, the caching latch circuit 231 may include a third PMOS transistor P3, a fourth PMOS transistor P4, and a second NMOS transistor N2 coupled in series between the power supply voltage stage VCCI and the ground voltage stage VSS. The gates of the first PMOS transistor P1 and the first NMOS transistor N1 may be coupled to a negative caching node QC_N, that is, the drain of the fourth PMOS transistor P4, in common. The gates of the third PMOS transistor P3 and the second NMOS transistor N2 may be coupled to a positive caching node QC, that is, the drain of the second PMOS transistor P2, in common. In this case, the second PMOS transistor P2 and the fourth PMOS transistor P4 may receive the first and second control signals HT_N and LT_N through gates thereof, respectively, and may perform a turn-on/off operation. Accordingly, when the first control signal HT_N is enabled, a logic "high" level may be stored in the positive caching node QC. When the second control signal LT_N is enabled, a logic "high" level may be stored in the negative caching node QC_N. Accordingly, the caching latch circuit 231 may store setup data based on the first and second control signals HT_N and LT_N.

The caching latch circuit 231 may include a third NMOS transistor N3 between the positive caching node QC and the ground voltage stage VSS. The third NMOS transistor N3 may receive a caching reset signal CRST through a gate thereof. Accordingly, the caching latch circuit 231 may perform a reset operation on the positive caching node QC based on the caching reset signal CRST. Furthermore, the caching latch circuit 231 may include a fourth NMOS transistor N4 and a fifth NMOS transistor N5 coupled in series between the negative caching node QC_N and the sensing node SO. The fourth NMOS transistor N4 may receive a first caching transfer signal TRANC through a gate thereof. The fifth NMOS transistor N5 may receive a second caching transfer signal TRANPB through a gate thereof. Accordingly, the caching latch circuit 231 may transfer setup data to the sensing node SO based on the first and second caching transfer signals TRANC and TRANPB.

The sensing latch circuit 232 may store, in a sensing operation, sensing data transferred through the first bit line BL1 is stored. The sensing latch circuit 232 may store the sensing data based on a sensing reset signal SRST and a sensing set signal SSET.

More specifically, the sensing latch circuit 232 may include a fifth PMOS transistor P5 and a sixth NMOS transistor N6 coupled in series between a core voltage stage VCORE and the ground voltage stage VSS. Furthermore, the sensing latch circuit 232 may include a sixth PMOS transistor P6 and a seventh NMOS transistor N7 coupled in series between the core voltage stage VCORE and the ground voltage stage VSS. The gates of the fifth PMOS transistor P5 and the sixth NMOS transistor N6 may be coupled to a negative sensing node QS_N in common, which is coupled to the sixth PMOS transistor P6 and the seventh NMOS transistor N7 in common. The gates of the sixth PMOS transistor P6 and the seventh NMOS transistor N7 may be coupled to a positive sensing node QS in common, which is coupled to the fifth PMOS transistor P5 and the sixth NMOS transistor N6 in common.

The sensing latch circuit 232 may include an eighth NMOS transistor N8 and a ninth NMOS transistor N9 coupled in series between the positive sensing node QS and the ground voltage stage VSS. In this case, the eighth NMOS transistor N8 may receive the sensing reset signal SRST through a gate thereof. The ninth NMOS transistor N9 may receive a page reset signal PBRST through a gate thereof. Furthermore, the sensing latch circuit 232 may include a tenth NMOS transistor N10 between the negative sensing node QS_N and a first common node COM1. In this case, the tenth N MOS transistor N10 may receive the sensing set signal SSET through a gate thereof. Accordingly, during a read operation, the sensing latch circuit 232 may store sensing data based on the sensing reset signal SRST and the sensing set signal SSET.

The sensing latch circuit 232 of the semiconductor memory device according to an embodiment may receive setup data from the caching latch circuit 231 during a setup operation prior to a program operation. This is described in more detail with reference to FIG. 4A.

The first to third data latch circuits 233_1, 233_2, and 233_3, that is, the plurality of data latch circuits 233, may store input data during a program operation. For reference, the three first to third data latch circuits 233_1, 233_2, and 233_3 may correspond to an SLC or an MLC or a TLC. Accordingly, for example, assuming that data corresponding to a TLC is input, the first data latch circuit 233_1 may receive data corresponding to the most significant bit (MSB). The second data latch circuit 233_2 may receive data corresponding to a central significant bit (CSB). The third data latch circuit 233_3 may receive data corresponding to the least significant bit (LSB). In an embodiment, a program operation corresponding to an SLC is described as an example. Accordingly, as is described again below, the first data latch circuit 233_1 may store input data. The second data latch circuit 233_2 may store setup data from the sensing latch circuit 232 during a program operation.

First, the first data latch circuit 233_1 may include a seventh PMOS transistor P7 and an eleventh NMOS transistor N11 coupled in series between the core voltage stage VCORE and the ground voltage stage VSS. Furthermore, the first data latch circuit 233_1 may include an eighth PMOS transistor P8 and a twelfth NMOS transistor N12 coupled in series between the core voltage stage VCORE and the ground voltage stage VSS. The gates of the seventh PMOS transistor P7 and the eleventh NMOS transistor N11 may be coupled to a first negative data node Q1_N in common. The gates of the eighth PMOS transistor P8 and the twelfth NMOS transistor N12 may be coupled to a first positive data node Q1 in common.

The first data latch circuit 233_1 may include a thirteenth NMOS transistor N13 and a fourteenth NMOS transistor N14 coupled in series between the sensing node SO and the ground voltage stage VSS. The thirteenth NMOS transistor N13 may receive a first positive data transfer signal TRAN1 through a gate thereof. The gate of the fourteenth NMOS transistor N14 may be coupled to the first positive data node Q1. The first data latch circuit 233_1 may include a fifteenth NMOS transistor N15 and a sixteenth NMOS transistor N16 coupled in series between the sensing node SO and the ground voltage stage VSS. The fifteenth NMOS transistor N15 may receive a first negative data transfer signal TRAN1_N through a gate thereof. The gate of the sixteenth NMOS transistor N16 may be coupled to the first negative data node Q1_N.

The first data latch circuit 233_1 may include a $161^{st}$ NMOS transistor N161 coupled between the first positive data node Q1 and the first common node COM1. The $161^{st}$ NMOS transistor N161 may receive a first data reset signal RST1 through a gate thereof. The first data latch circuit 233_1 may include a seventeenth NMOS transistor N17 coupled between the first negative data node Q1_N and the first common node COM1. The seventeenth NMOS transistor N17 may receive a first data set signal SET1 through a gate thereof.

Accordingly, the first data latch circuit 233_1 may perform an initialization operation and a data transfer operation based on the first positive and negative data transfer signals TRAN1. and TRAN1_N and the first data reset and set signals RST1 and SET1.

The first to third data latch circuits 233_1, 233_2, and 233_3 have similar internal configurations except for their input control signals; thus, detailed description of the second and third data latch circuits 233_2 and 233_3 are omitted. In this case, the second data latch circuit 233_2 has second positive and negative data nodes Q2 and Q2_N formed therein, and may perform an initialization operation and a data transfer operation based on second positive and negative data transfer signals TRAN2 and TRAN2_N and second data reset and set signals RST2 and SET2. Furthermore, the third data latch circuit 233_3 has third positive and negative data nodes Q3 and Q3_N formed therein, and may perform an initialization operation and a data transfer operation based on third positive and negative data transfer signals TRAN3 and TRAN3_N and third data reset and set signals RST3 and SET3.

The first and second verification latch circuits 234_1 and 234_2, that is, the verification latch circuit 234, may store verification data during a verification operation performed during a program operation. In this case, the first and second verification latch circuits 234_1 and 234_2 may perform a verification operation twice during a program operation in order to improve retention characteristic of a memory cell during a program operation.

First, the first verification latch circuit 234_1 may include a ninth PMOS transistor P9 and an eighteenth NMOS transistor N18 coupled in series between the core voltage stage VCORE and the ground voltage stage VSS. Furthermore, the first verification latch circuit 234_1 may include a tenth PMOS transistor P10 and a nineteenth NMOS transistor N19 coupled in series between the core voltage stage VCORE and the ground voltage stage VSS. The gates of the ninth PMOS transistor P9 and the eighteenth NMOS transistor N18 may be coupled to a first negative verification node QM_N in common. The gates of the tenth PMOS transistor P10 and the nineteenth NMOS transistor N19 may be coupled to a first positive verification node QM in common.

The first verification latch circuit 234_1 may include a twentieth NMOS transistor N20 and a twenty-first NMOS transistor N21 coupled in series between the sensing node SO and the ground voltage stage VSS. The twentieth NMOS transistor N20 may receive a first verification transfer signal TRANM through a gate thereof.

The first verification latch circuit 234_1 may include a twenty-second NMOS transistor N22 coupled between the first positive verification node QM and a third common node COM3. The twenty-second NMOS transistor N22 may receive a first verification reset signal MRST through a gate thereof. The first verification latch circuit 234_1 may include a twenty-third NMOS transistor N23 coupled between the first negative verification node QM_N and the third common node COM3. The twenty-third NMOS transistor N23 may receive a first verification set signal MSET through a gate thereof.

Accordingly, the first verification latch circuit 234_1 may perform an initialization operation and a data verification operation based on the first verification transfer signal TRANM and the first verification reset and set signals MRST and MSET. The first verification latch circuit 234_1 and the second verification latch circuit 234_2 have similar internal configurations except for their input control signals, and thus a detailed description of the second verification latch circuit 234_2 is omitted. In this case, the second verification latch circuit 234_2 has second positive and negative verification nodes QD and QD_N formed therein, and may perform an initialization operation and a data verification operation based on a second verification transfer signal TRAND and second verification reset and set signals DRST and DSET.

A twenty-fourth NMOS transistor N24 may be coupled between the ground voltage stage VSS and the first common node COM1 that is coupled to the sensing latch circuit 232 and the first data latch circuit 233_1 in common. Furthermore, a twenty-fifth NMOS transistor N25 may be coupled between the ground voltage stage VSS and a second common node COM2 that is coupled to the second data latch circuit 233_2 and the third data latch circuit 233_3 in common. Furthermore, a twenty-sixth NMOS transistor N26 may be coupled between the ground voltage stage VSS and the third common node COM3 that is coupled to the first verification latch circuit 234_1 and the second verification latch circuit 234_2 in common. The gates of the twenty-fourth NMOS transistor N24, the twenty-fifth NMOS transistor N25, and the twenty-sixth NMOS transistor N26 may be coupled to the sensing node SO. Accordingly, the twenty-fourth NMOS transistor N24, the twenty-fifth NMOS transistor N25, and the twenty-sixth NMOS transistor N26 form a current path coupled to the ground voltage stage VSS, based on a voltage level of the sensing node SO.

The bit line coupling circuit 235 may transfer input data from the sensing node SO to the first bit line BL1 by selectively coupling the first bit line BL1. As described below, the input data transferred through the sensing node SO may be transferred to a current sensing node CSO through the data sensing circuit 236. Accordingly, the bit line coupling circuit 235 may transfer input data from the sensing node SO to the first bit line BL1 through the current sensing node CSO by coupling the first bit line BL1 and the current sensing node CSO based on a bit line selection signal SEL_BL.

More specifically, the bit line coupling circuit 235 may include a twenty-seventh NMOS transistor N27 and a twenty-eighth NMOS transistor N28 coupled in series between the first bit line BL1 and the ground voltage stage VSS. The twenty-seventh NMOS transistor N27 may receive the bit line selection signal SEL_BL through a gate thereof. The twenty-eighth NMOS transistor N28 may receive a bit line discharge signal BLDIS through a gate thereof.

The bit line coupling circuit 235 may include a twenty-ninth NMOS transistor N29 coupled between a buffer voltage stage VEXT_PB and the first bit line BL1. The twenty-ninth NMOS transistor N29 may receive an erase control voltage BL_BIAS through a gate thereof. Furthermore, the bit line coupling circuit 235 may include a thirtieth NMOS transistor N30 coupled between and the current sensing node CSO and a common node BLCM of the twenty-seventh NMOS transistor N27 and the twenty-eighth NMOS transistor N28. The thirtieth NMOS transistor N30 may receive a bit line sensing signal PB_SENSE through a gate thereof.

Accordingly, the bit line coupling circuit 235 may transfer input data from the sensing node SO to the first bit line BL1 based on the bit line selection signal SEL_BL and the bit line sensing signal PB_SENSE.

During a program operation, the data sensing circuit 236 may transfer data from the sensing node SO to the bit line coupling circuit 235. During a read operation, the data sensing circuit 236 may sense data transferred through the first bit line BL1, and may transfer the sensed data to the sensing node SO.

More specifically, the data sensing circuit 236 may include an eleventh PMOS transistor P11, a twelfth PMOS transistor P12, and a thirty-first NMOS transistor N31 coupled in series between the core voltage stage VCORE and the current sensing node CSO. The gate of the eleventh PMOS transistor P11 may be coupled to the positive sensing node QS. The twelfth PMOS transistor P12 may receive a precharge control signal SA_PRECH_N through a gate thereof. The thirty-first NMOS transistor N31 may receive a sensing control signal SA_SENSE through a gate thereof. The data sensing circuit 236 may include a thirty-second NMOS transistor N32 between the drain of the eleventh PMOS transistor P11 and the current sensing node CSO. The thirty-second NMOS transistor N32 may receive a sense amp coupling signal SA_CSOC through a gate thereof.

The data sensing circuit 236 may include a thirty-third NMOS transistor N33 and a thirty-fourth NMOS transistor N34 coupled in series between the sensing node SO and the ground voltage stage VSS. The thirty-third NMOS transistor N33 may receive a sense amp discharge signal SA_DISCH through a gate thereof. The gate of the thirty-fourth NMOS transistor N34 may be coupled to the positive sensing node QS.

Accordingly, during a program operation, the data sensing circuit 236 may transfer data from the sensing node SO to the bit line coupling circuit 235 based on the sensing control signal SA_SENSE and the sense amp coupling signal SA_CSOC. During a read operation, the data sensing circuit 236 may sense data transferred through the first bit line BL1, and may transfer the sensed data to the sensing node SO.

The first page buffer circuit 230_1 may include a thirteenth PMOS transistor P13 for precharging the sensing node SO. The thirteenth PMOS transistor P13 may be coupled between the core voltage stage VCORE and the sensing node SO, and may receive a precharge signal PRECHSO_N through a gate thereof. Accordingly, the thirteenth PMOS transistor P13 may precharge the sensing node SO to a voltage level corresponding to the core voltage stage VCORE, based on the precharge signal PRECHSO_N.

The semiconductor memory device according to an embodiment may increase overall program operation speed by changing the setup-data-latch sequence during a setup operation and a program operation. Hereinafter, the setup-data-latch sequence during a setup operation and a program operation is described with reference to FIGS. 4A and 4B.

Figure 4A:
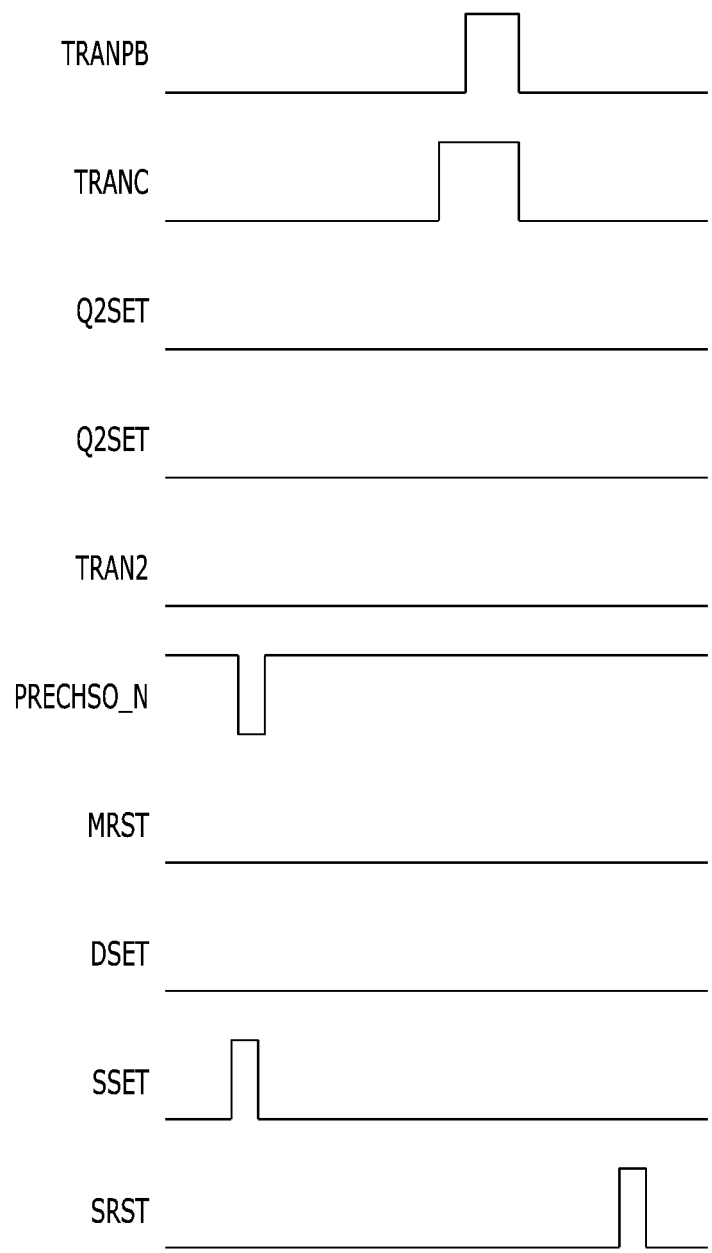
FIGS. 4A and 4B are timing diagrams illustrating some operations of a semiconductor memory device according to an embodiment.
Figure 4B:
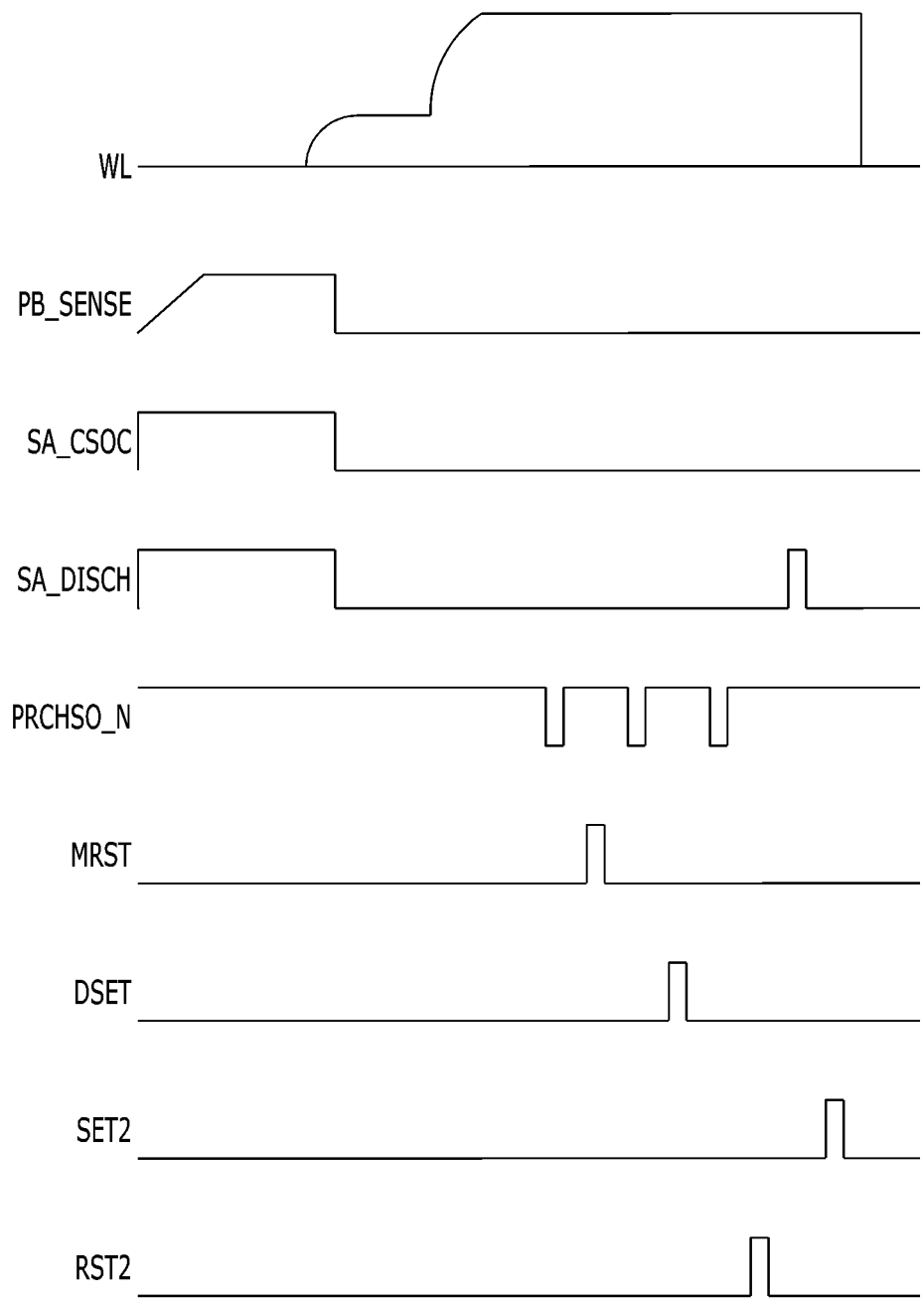

FIGS. 4A and 4B are timing diagrams illustrating some operations of the semiconductor memory device according to an embodiment. FIG. 4A is a timing diagram corresponding to a setup operation. FIG. 4B is a timing diagram corresponding to a program operation. For reference, it is assumed that the first setup data has been stored in the caching latch circuit 231 based on the first and second control signals HT_N and LT_N and the bit line selection signal SEL_BL maintains a logic "high" state.

Referring to FIG. 4A, during a setup operation, the semiconductor memory device may precharge the sensing node SO based on the precharge signal PRECHSO_N. In this case, the precharge signal PRECHSO_N may be a pulse signal enabled to a logic "low" level. Accordingly, the sensing node SO may be precharged to a voltage level corresponding to a level of the core voltage stage VCORE, based on the precharge signal PRECHSO_N.

The sensing set signal SSET of the sensing latch circuit 232 may be enabled. Accordingly, the negative sensing node QS_N may be initialized as a logic "low" level based on the sensing set signal SSET. The positive sensing node QS may be initialized as a logic "high" level.

The first caching transfer signal TRANC and second caching transfer signal TRANPB of the caching latch circuit 231 may be sequentially enabled. Accordingly, setup data stored in the caching latch circuit 231 may be transferred to the sensing node SO. Furthermore, the setup data transferred to the sensing node SO may be applied to the gate of the twenty-fourth NMOS transistor N24.

The sensing reset signal SRST of the sensing latch circuit 232 may be enabled. In this case, since the setup data transferred through the sensing node SO is applied to the gate of the twenty-fourth NMOS transistor N24, a logic level of the positive sensing node QS may be determined based on the setup data. Accordingly, the sensing latch circuit 232 may store the setup data in the positive sensing node QS.

During a setup operation prior to a program operation, the semiconductor memory device according to an embodiment may transfer setup data from the caching latch circuit 231 to the sensing latch circuit 232 and store the transferred setup data in the sensing latch circuit 232. Accordingly, the setup-data-latch sequence can be minimized in transferring the setup data from the caching latch circuit 231 to the sensing latch circuit 232.

Referring to FIG. 4B, in the semiconductor memory device according to an embodiment, during a program operation, the bit line sensing signal PB_SENSE of the bit line coupling circuit 235 may be slowly enabled, and the sense amp coupling signal SA_CSOC and sense amp discharge signal SA_DISCH of the data sensing circuit 236 may be enabled. Accordingly, setup data stored in the sensing latch circuit 232 may be transferred to the first bit line BL1 through the current sensing node CSO. The first bit line BL1 may be driven by the setup data before a program pulse is applied.

During a program operation, a program pulse may be applied to a particular word line WL using an incremental step pulse program (ISPP) method. Using the ISPP method the voltage level of the program pulse is gradually increased. Although not illustrated in the drawings, a verification operation may be performed on input data, which is stored during a program operation, between applications of program pulses to the word line WL.

During a program operation, the first verification reset signal MRST of the first verification latch circuit 234_1 may be enabled, and the second verification set signal DSET of the second verification latch circuit 234_2 may be enabled. The first and second verification latch circuits 234_1 and 234_2 may perform initialization operations based on the first verification reset signal MRST and the second verification set signal DSET, respectively.

During a program operation, the second data reset signal RST2 of the second data latch circuit 233_2 may be enabled. Accordingly, the second data latch circuit 233_2 may be initialized based on the second data reset signal RST2. Thereafter, when the precharge signal PRECHSO_N is enabled, the sensing node SO may be precharged. When the sense amp discharge signal SA_DISCH is enabled, setup data stored in the sensing latch circuit 232 may be transferred to the sensing node SO. Thereafter, the second data set signal SET2 of the second data latch circuit 233_2 may be enabled. Accordingly, the setup data may be stored in the second data latch circuit 233_2.

During the program operation, the semiconductor memory device according to an embodiment may initialize the first and second verification latch circuits 234_1 and 234_2 and may latch, in the second data latch circuit 233_2, setup data from the sensing latch circuit 232.

Figure 5A:
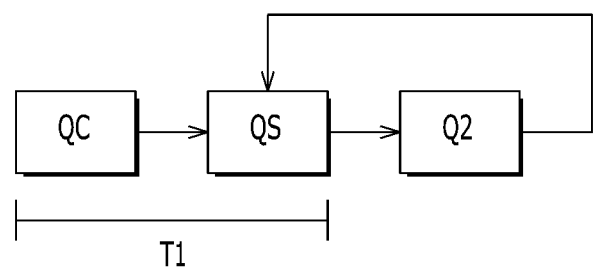
FIGS. 5A and 5B are schematic diagrams illustrating a setup-data-latch sequence in the first page buffer circuit, such as that of FIGS. 3A and 3B.
Figure 5B:
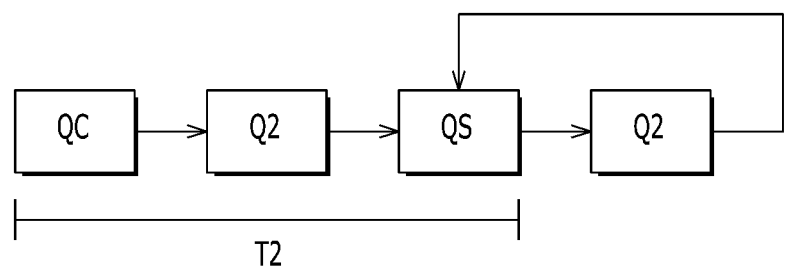

FIGS. 5A and 5B are schematic diagrams illustrating the setup-data-latch sequence in the first page buffer circuit 230_1 of FIGS. 3A and 3B. Hereinafter, the setup-data-latch sequence in FIG. 5A is denoted a "first setup-data-latch sequence" and the setup-data-latch sequence in FIG. 5B is denoted a "second setup-data-latch sequence". The semiconductor memory device according to an embodiment may latch the setup data according to the first and second setup-data-latch sequences having different latch sequences of setup data.

Referring to FIGS. 3A, 3B and 5A, setup data based on the first setup-data-latch sequence, as described above, may be stored in the positive cache node QC of the caching latch circuit 231 during a setup operation prior to an initial program operation. Thereafter, the setup data stored in the positive cache node QC may be transferred to the positive sensing node QS of the sensing latch circuit 232. The first bit line BL1 may be driven by the setup data stored in the positive sensing node QS. During a program operation, the setup data stored in the positive sensing node QS of the sensing latch circuit 232 may be transferred to the second positive data node Q2 of the second data latch circuit 233_2. After the program operation, the setup data stored in the second positive data node Q2 may be transferred to the positive sensing node QS of the sensing latch circuit 232 for a next program operation. Sensing data transferred to the positive sensing node QS may be used to drive the first bit line BL1 for a next program operation. Then, the next program operation may be performed.

According to the first setup-data-latch sequence, the initial program operation may be performed after the setup data is transferred to the positive sensing node QS of the sensing latch circuit 232. That is, as illustrated in FIG. 5A, a setup operation time based on the first setup-data-latch sequence may be defined as "T1." After the setup operation time "T1", the initial program operation may be performed.

Referring to FIGS. 3A, 3B and 5B, setup data may be stored in the positive cache node QC of the caching latch circuit 231 during a setup operation prior to the initial program operation. Thereafter, the setup data stored in the positive cache node QC may be transferred to the second positive data node Q2 of the second data latch circuit 233_2. Thereafter, the setup data stored in the second positive data node Q2 may be transferred to the positive sensing node QS of the sensing latch circuit 232. The first bit line BL1 may be driven by the setup data stored in the positive sensing node QS. During a program operation, the setup data stored in the sensing latch circuit 232 may be transferred to the second positive data node Q2 of the second data latch circuit 233_2. After the program operation, for a next program operation, the setup data stored in the second positive data node Q2 may be transferred to the positive sensing node QS of the sensing latch circuit 232. Sensing data transferred to the positive sensing node QS may be used to drive the first bit line BL1 for a next program operation. Furthermore, the next program operation may be performed.

In the second setup-data-latch sequence, the initial program operation may be performed after the setup data is transferred to the positive sensing node QS of the sensing latch circuit 232. That is, as illustrated in FIG. 5B, a setup operation time based on the second setup-data-latch sequence may be defined as "T2." After the setup operation time "T2", the initial program operation may be performed.

As may be seen from FIGS. 5A and 5B, initial program operation timing based on the first setup-data-latch sequence and initial program operation timing based on the second setup-data-latch sequence may be different. In other words, in the first setup-data-latch sequence, the initial program operation may be performed relatively rapidly because the setup operation time is "T1." In the second setup-data-latch sequence, the initial program operation may be performed relatively slowly because the setup operation time is "T2", which is longer than "T1." Accordingly, the first setup-data-latch sequence may be applied to a semiconductor memory system that satisfies a condition in which the initial program operation is relatively fast. The second setup-data-latch sequence may be applied to a semiconductor memory system that satisfies a condition in which the initial program operation is relatively slow. Hereinafter, a semiconductor memory system to which the first and second setup-data-latch sequences are applied is described.

Figure 6:
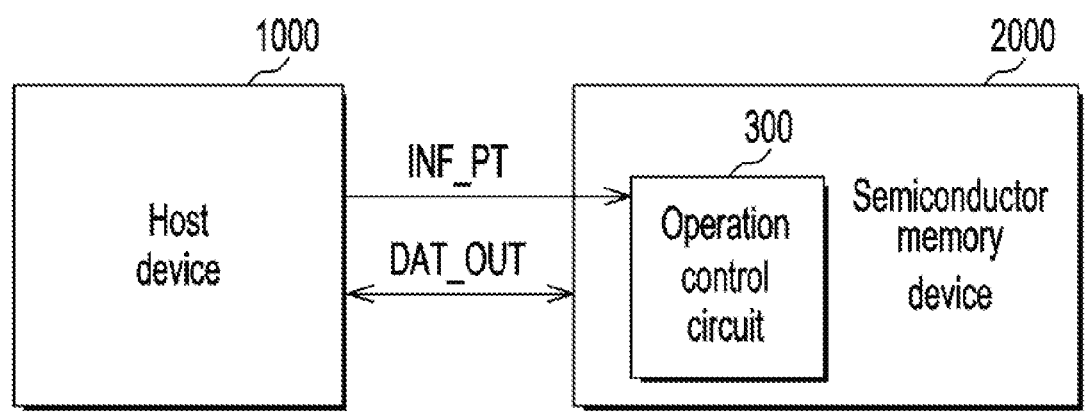
FIG. 6 is a block diagram illustrating a configuration of a semiconductor memory system according to an embodiment.

FIG. 6 is a block diagram illustrating a configuration of a semiconductor memory system according to an embodiment.

Referring to FIG. 6, the semiconductor memory system may include a host device 1000 and a semiconductor memory device 2000.

First, the host device 1000 may store data in the semiconductor memory device 2000 or receive data stored in the semiconductor memory device 2000. The host device 1000 may exchange data DAT_OUT with the semiconductor memory device 2000 or data stored in the semiconductor memory device 2000. The host device 1000 may provide program timing information INF_PT to the semiconductor memory device 2000. The program timing information INF_PT may pertain to program operation timing of the semiconductor memory device 2000.

The semiconductor memory device 2000 may store data DAT_OUT provided by the host device 1000 or output stored data as DAT_OUT. The semiconductor memory device 2000 may include the operation control circuit 300 of FIG. 1. The operation control circuit 300 may perform a program operation and a read operation. In this case, the operation control circuit 300 may control a setup operation time and program operation timing based on the program timing information INF_PT provided by the host device 1000. In other words, the operation control circuit 300 may change the setup-data-latch sequence to the first setup-data-latch sequence or the second setup-data-latch sequence based on the program timing information INF_PT. The first setup-data-latch sequence and the second setup-data-latch sequence may have different setup operation times, as already described with reference to FIGS. 5A and 5B.

First, the semiconductor memory device 2000 may perform a setup operation in the first setup-data-latch sequence based on the program timing information INF_PT. In other words, the semiconductor memory device 2000 may store setup data in the positive cache node QC of the caching latch circuit 231, and may transfer the setup data from the positive cache node QC to the positive sensing node QS of the sensing latch circuit 232. Furthermore, after driving the first bit line BL1 using the setup data, the semiconductor memory device 2000 may perform a program operation. Furthermore, during the program operation, the semiconductor memory device 2000 may transfer the setup data from the positive sensing node QS of the sensing latch circuit 232 to the second positive data node Q2 of the second data latch circuit 233_2.

The semiconductor memory device 2000 may perform a setup operation in the second setup-data-latch sequence based on the program timing information INF_PT. In other words, the semiconductor memory device 2000 may store setup data in the positive cache node QC of the caching latch circuit 231, may transfer the setup data from the positive cache node QC to the second positive data node Q2 of the second data latch circuit 233_2, and may transfer the setup data from the second positive data node Q2 to the positive sensing node QS of the sensing latch circuit 232. Furthermore, after driving the first bit line BL1 using the setup data, the semiconductor memory device 2000 may perform a program operation. In the second setup-data-latch sequence, unlike the first setup-data-latch sequence, during a setup operation, the setup data may be stored in the second positive data node Q2 of the second data latch circuit 233_2.

As a result, if the host device 1000 wants relatively fast program timing, the semiconductor memory device 2000 may perform a setup operation in the first setup-data-latch sequence. Furthermore, if the host device 1000 wants relatively slow program timing, the semiconductor memory device 2000 may perform a setup operation in the second setup-data-latch sequence. Accordingly, the semiconductor memory device 2000 can control a setup operation time based on the program timing information INF_PT. In this case, to control the setup operation time may mean that program timing is controlled.

The semiconductor memory system according to an embodiment can control a setup operation time and program timing based on the program timing information INF_PT provided by the host device 1000. Accordingly, the semiconductor memory system can improve system compatibility between the host device 1000 and the semiconductor memory device 2000.

An embodiment has an effect in that it can increase overall program operation speed by changing the setup-data-latch sequence during a setup operation and a program operation.

An embodiment has an effect in that it can improve the compatibility of a system by controlling a setup operation time and program operation timing based on a system operation.

Effects of the present disclosure are not limited to those described above; other effects not described above may be understood by those skilled in the art to which the present disclosure pertains from the above description.

Although various embodiments have been illustrated and described, it will be apparent to those skilled in the art that various changes and modifications may be made without departing from the spirit and scope of the invention as defined in the following claims.

What is claimed is:

1. A semiconductor memory device comprising:
    a memory cell array configured to store input data received from an external source; and
    a plurality of page buffer circuits coupled to the memory cell array through a bit line and configured to transfer the input data to the bit line during a program operation,
    wherein each of the plurality of page buffer circuits comprises:
        a caching latch circuit coupled to a sensing node to which the input data is transferred and configured to store setup data; and
        a sensing latch circuit configured to store sensing data sensed through the bit line during a sensing operation,
    wherein, during a setup operation prior to the program operation, the setup data stored in the caching latch circuit is transferred to the sensing latch circuit.

2. The semiconductor memory device of claim 1,
    further comprising a plurality of data latch circuits configured to store the input data during the program operation,
    wherein at least one of the plurality of data latch circuits stores the setup data from the sensing latch circuit during the program operation.

3. The semiconductor memory device of claim 1,
    further comprising a verification latch circuit configured to store verification data during a verification operation of the program operation,
    wherein the verification latch circuit is initialized during the program operation.

4. The semiconductor memory device of claim 1, further comprising:
    a bit line coupling circuit configured to transfer the input data from the sensing node to the bit line by selectively coupling the bit line; and
    a data sensing circuit configured to transfer data from the sensing node to the bit line coupling circuit during the program operation and to sense data from the bit line during a read operation.

5. An operating method of a semiconductor memory device, comprising:
    transferring setup data from a caching latch circuit to a sensing latch circuit and storing the setup data in the sensing latch circuit, during a setup operation prior to performing a program operation;

driving a bit line by the setup data stored in the sensing latch circuit; and transferring the setup data from the sensing latch circuit to at least one of a plurality of data latch circuits during the program operation.

6. The operating method of claim 5, further comprising transferring the setup data from the data latch circuit to the sensing latch circuit for a next program operation after the program operation.

7. The operating method of claim 6, further comprising performing the next program operation after driving the bit line by the setup data, stored in the sensing latch circuit, for the next program operation.

8. A semiconductor memory system comprising:
a host device configured to provide program timing information; and
a semiconductor memory device configured to control a setup operation time based on the program timing information,
wherein the semiconductor memory device controls the setup operation time by changing a setup-data-latch sequence based on the program timing information.

9. The semiconductor memory system of claim 8, wherein the setup-data-latch sequence comprises first and second setup-data-latch sequences having different setup operation times.

10. The semiconductor memory system of claim 9, wherein, based on the first setup-data-latch sequence, the semiconductor memory device is further configured to:
store a setup data in a caching latch circuit,
transfer the setup data from the caching latch circuit to a sensing latch circuit, and
then drive a bit line by the setup data.

11. The semiconductor memory system of claim 10, wherein the semiconductor memory device is further configured to transfer the setup data from the sensing latch circuit to at least one of a plurality of data latch circuits during a program operation.

12. The semiconductor memory system of claim 9, wherein, based on the second setup-data-latch sequence, the semiconductor memory device is further configured to:
store a setup data in a caching latch circuit,
transfer the setup data from the caching latch circuit to at least one of a plurality of data latch circuits,
transfer the setup data from the data latch circuit to a sensing latch circuit, and
then drive a bit line by the setup data.

13. A semiconductor memory device comprising:
a memory cell array configured to store program data;
a first latch configured to generate setup data;
a second latch configured to latch the setup data from the first latch during a setup operation; and
a third latch configured to latch the setup data from the second latch during a program operation of storing the program data into the memory cell array after the setup operation,
wherein the second latch is further configured to latch again, after the program operation, the setup data from the third latch for a subsequent program operation, and
wherein a bit line is coupled to the array and driven by the setup data latched in the second latch.

14. The semiconductor memory device of claim 13,
wherein the third latch is further configured to latch the setup data from the first latch during the setup operation,
wherein the second latch latches the setup data from the first latch through the third latch during the setup operation.

* * * * *